United States Patent
Myers et al.

(10) Patent No.: US 12,255,633 B2
(45) Date of Patent: Mar. 18, 2025

(54) FILTER USING TRANSVERSELY-EXCITED FILM BULK ACOUSTIC RESONATORS

(71) Applicant: Murata Manufacturing Co., Ltd., Nagaokakyo (JP)

(72) Inventors: Luke Myers, Santa Barbara, CA (US); Wei Yang, Goleta, CA (US); Andrew Guyette, San Mateo, CA (US); Greg Dyer, Santa Barbara, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 322 days.

(21) Appl. No.: 17/722,344

(22) Filed: Apr. 17, 2022

(65) Prior Publication Data
US 2022/0337224 A1    Oct. 20, 2022

Related U.S. Application Data

(60) Provisional application No. 63/175,933, filed on Apr. 16, 2021.

(51) Int. Cl.
*H03H 9/60* (2006.01)
*H03H 9/13* (2006.01)
*H03H 9/205* (2006.01)

(52) U.S. Cl.
CPC .............. *H03H 9/605* (2013.01); *H03H 9/13* (2013.01); *H03H 9/205* (2013.01)

(58) Field of Classification Search
CPC .......... H03H 9/605; H03H 9/13; H03H 9/205; H03H 2003/023; H03H 3/02; H03H 9/02015; H03H 9/174; H03H 9/02228; H03H 9/568

USPC ................ 333/133, 186, 187, 188, 193–196
See application file for complete search history.

(56) References Cited

U.S. PATENT DOCUMENTS

| | | | |
|---|---|---|---|
| 5,204,575 | A | 4/1993 | Kanda et al. |
| 5,274,345 | A | 12/1993 | Gau |
| 5,446,330 | A | 8/1995 | Eda et al. |
| 5,552,655 | A | 9/1996 | Stokes et al. |
| 5,726,610 | A | 3/1998 | Allen et al. |
| 5,729,186 | A | 3/1998 | Seki et al. |
| 5,853,601 | A | 12/1998 | Krishaswamy |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Jorge L Salazar, Jr.
(74) *Attorney, Agent, or Firm* — ARENTFOX SCHIFF LLP

(57) ABSTRACT

A 5 GHz Wi-Fi bandpass filter includes a ladder filter circuit with two or more shunt transversely-excited film bulk acoustic resonators (XBARs) and two or more series XBARs. Each of the two or more shunt XBARS includes a diaphragm having an LN-equivalent thickness greater than or equal to 360 nm, and each of the two or more series XBARS includes a diaphragm having an LN-equivalent thickness less than or equal to 375 nm.

14 Claims, 11 Drawing Sheets

(56) References Cited

U.S. PATENT DOCUMENTS

| | | |
|---|---|---|
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0175945 A1 | 6/2014 | Kando |
| 2014/0225684 A1 | 8/2014 | Kando et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0159494 A1 | 6/2018 | Goto et al. |
| 2018/0191322 A1 | 7/2018 | Chang et al. |
| 2018/0278227 A1 | 9/2018 | Hurwitz |
| 2018/0309426 A1 | 10/2018 | Guenard |
| 2019/0068164 A1 | 2/2019 | Houlden et al. |
| 2019/0123721 A1 | 4/2019 | Takamine |

(56) References Cited

U.S. PATENT DOCUMENTS

| | | | |
|---|---|---|---|
| 2019/0131953 | A1 | 5/2019 | Gong |
| 2019/0273480 | A1 | 9/2019 | Lin et al. |
| 2019/0348966 | A1 | 11/2019 | Campanella-Pineda |
| 2019/0379351 | A1 | 12/2019 | Miyamoto et al. |
| 2019/0386635 | A1 | 12/2019 | Plesski et al. |
| 2019/0386636 | A1 | 12/2019 | Plesski et al. |
| 2020/0007110 | A1 | 1/2020 | Konaka et al. |
| 2020/0021272 | A1 | 1/2020 | Segovia Fernandez et al. |
| 2020/0036357 | A1 | 1/2020 | Mimura |
| 2020/0235719 | A1 | 7/2020 | Yantchev et al. |
| 2020/0259480 | A1 | 8/2020 | Pensala |
| 2020/0274520 | A1 | 8/2020 | Shin |
| 2020/0313645 | A1 | 10/2020 | Caron |
| 2020/0350891 | A1 | 11/2020 | Turner |
| 2021/0013859 | A1 | 1/2021 | Turner et al. |
| 2021/0265978 | A1 | 8/2021 | Plesski et al. |
| 2021/0273631 | A1* | 9/2021 | Jachowski .............. H03H 9/132 |
| 2021/0328574 | A1 | 10/2021 | Garcia |
| 2021/0351762 | A1 | 11/2021 | Dyer et al. |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SHO Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja. 4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Wu et al., "Frequency band-gap measurement of two-dimensional air/silicon phononic crystals using layered slanted finger interdigital transducers", J. Appl. Phys. 97, 094916, 2005 (Year: 2005).

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) Jan. 2015.

(56) References Cited

OTHER PUBLICATIONS

USPTO/ISA, International Search Report and Written Opinion for PCT Application No. PCT/US22/25236, mail date Sep. 23, 2022.

* cited by examiner

FILTER USING TRANSVERSELY-EXCITED FILM BULK ACOUSTIC RESONATORS

RELATED APPLICATION INFORMATION

This patent claims priority from provisional patent application 63/175,933, titled XBAR FILTERS FOR 5 GHZ WI-FI, filed Apr. 16, 2021.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. Wi-Fi™ bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) at least partially disposed on a thin floating layer, or diaphragm which is or includes a layer of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
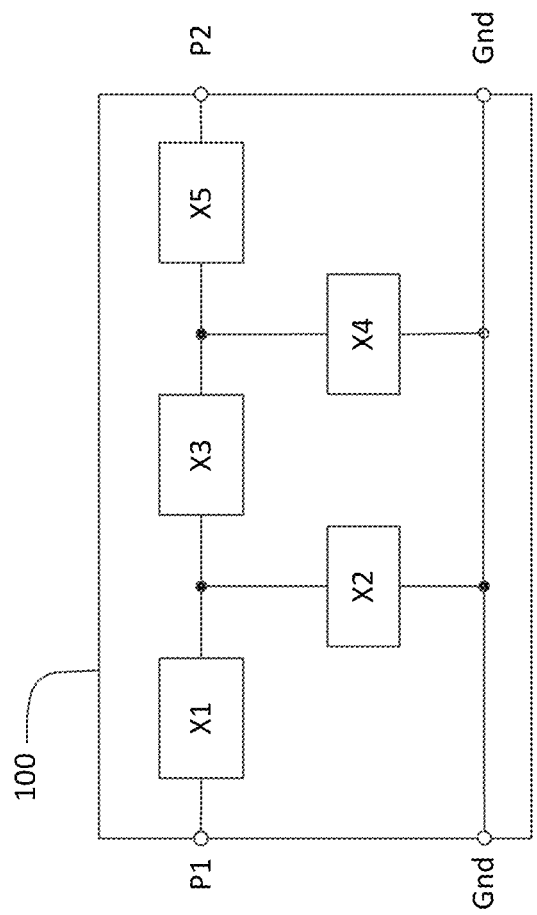
FIG. 1 is a schematic diagram of an exemplary band-pass filter.

FIG. 1 is a schematic circuit diagram of an exemplary band-pass filter 100 using five XBARs X1-X5. The filter 100 may be, for example, a band-pass filter for use in a communication device. The filter 100 has a conventional ladder filter architecture including three series resonators X1, X3, X5 and two shunt resonators X2, X4. The three series resonators X1, X3, X5 are connected in series between a first port P1 and a second port P2. The filter 100 is bidirectional and either port may serve as the input or output of the filter. The two shunt resonators X2, X4 are connected from nodes between the series resonators to ground. All the shunt resonators and series resonators may be XBARs.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the input and output ports is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, resonance frequencies of the shunt resonators are positioned below the passband of the filter and the anti-resonance frequencies of the shunt resonators are within the passband. Resonance frequencies of the series resonators are within the passband and the anti-resonance frequencies of the series resonators are positioned above the passband.

Figure 2:
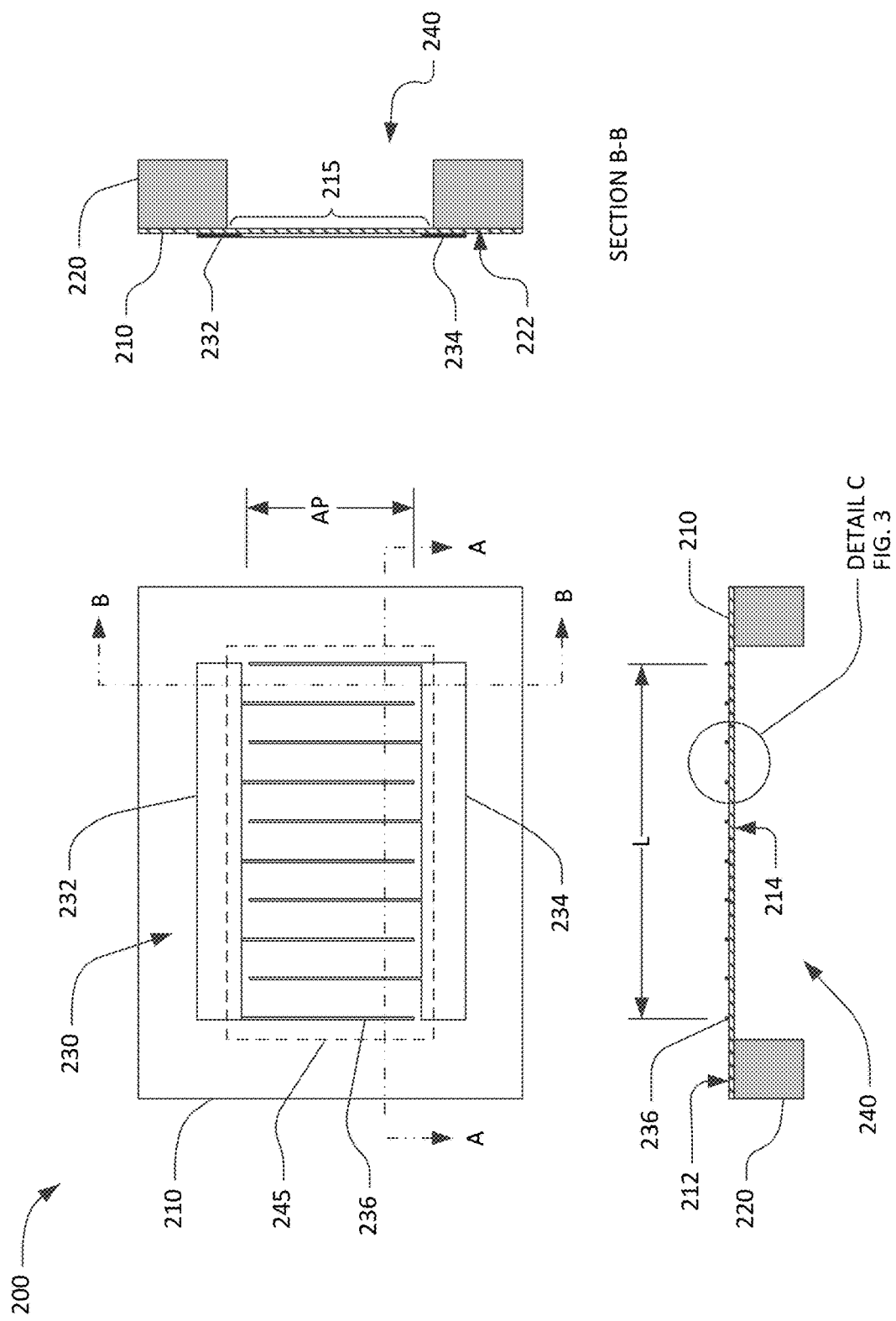
FIG. 2 has a schematic plan view and two schematic cross-sectional views of a transversely-excited film bulk acoustic resonator (XBAR).

Referring now to FIG. 2, the structure of XBARs will be described in further detail. FIG. 2 shows a simplified schematic top view and orthogonal cross-sectional views of a an XBAR 200. The XBAR 200 is made up of a thin film conductor pattern formed on a surface of a piezoelectric plate 210 having a front surface 212 and a back surface 214. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are rotated YX-cut. However, XBARs may be fabricated on piezoelectric plates with other crystallographic orientations including rotated Z-cut and rotated Z-cut.

The back surface 214 of the piezoelectric plate 210 is attached to a surface 222 of the substrate 220 except for a portion of the piezoelectric plate 210 that forms a diaphragm 215 spanning a cavity 240 formed in the substrate 220. The cavity 240 has a perimeter defined by the intersection of the cavity and the surface 222 of the substrate 220. The portion of the piezoelectric plate that spans the cavity is referred to herein as the "diaphragm" due to its physical resemblance to the diaphragm of a microphone. As shown in FIG. 2, the diaphragm 215 is contiguous with the rest of the piezoelectric plate 210 around all of the perimeter 245 of the cavity 240. In this context, "contiguous" means "continuously connected without any intervening item".

The substrate 220 provides mechanical support to the piezoelectric plate 210. The substrate 220 may be, for example, silicon, sapphire, quartz, or some other material or combination of materials. The back surface 214 of the piezoelectric plate 210 may be attached to the substrate 220 using a wafer bonding process. Alternatively, the piezoelectric plate 210 may be grown on the substrate 220 or otherwise attached to the substrate. The piezoelectric plate 210 may be attached directly to the substrate or may be attached to the substrate 220 via one or more intermediate material layers.

The cavity 240 is an empty space within a solid body of the resonator 200. The cavity 240 may be a hole completely through the substrate 220 (as shown in Section A-A and Section B-B) or a recess in the substrate 220 (not shown) that extends down from the diaphragm 215 into but not all the way through the substrate 220. The cavity 240 may be formed, for example, by selective etching of the substrate 220 before or after the piezoelectric plate 210 and the substrate 220 are attached.

The conductor pattern of the XBAR 200 includes an interdigital transducer (IDT) 230. An IDT is an electrode structure for converting between electrical and acoustic energy in piezoelectric devices. The IDT 230 includes a first plurality of parallel elongated conductors, commonly called "fingers", such as finger 236, extending from a first busbar 232. The IDT 230 includes a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT.

The term "busbar" refers to the conductors that interconnect the first and second sets of fingers in an IDT. As shown in FIG. 2, each busbar 232, 234 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 232, 234 serve as the terminals of the XBAR 200. A radio frequency or microwave signal applied between the two busbars 232, 234 of the IDT 230 excites a primary acoustic mode within the piezoelectric plate 210. As will be discussed in further detail, the primary acoustic mode is a bulk shear mode where acoustic energy propagates along a direction substantially orthogonal to the surface of the piezoelectric plate 210, which is also normal, or transverse, to the direction of the electric field created by the IDT fingers. Thus, the XBAR is considered a transversely-excited film bulk wave resonator.

The IDT 230 is positioned on the piezoelectric plate 210 such that at least a substantial portion of the fingers of the IDT 230 are disposed on the diaphragm 215 of the piezoelectric plate that spans, or is suspended over, the cavity 240. As shown in FIG. 2, the cavity 240 has a rectangular shape with an extent greater than the aperture AP and length L of the IDT 230. A cavity of an XBAR may have a different shape, such as a regular or irregular polygon. The cavity of an XBAR may have more or fewer than four sides, which may be straight or curved.

For ease of presentation in FIG. 2, the geometric pitch and width of the IDT fingers is greatly exaggerated with respect to the length (dimension L) and aperture (dimension AP) of the XBAR. An XBAR for a 5G device will have more than ten parallel fingers in the IDT 210. An XBAR may have hundreds, possibly thousands, of parallel fingers in the IDT 210. Similarly, the thickness of the fingers in the cross-sectional views is greatly exaggerated in the drawings.

Figure 3:
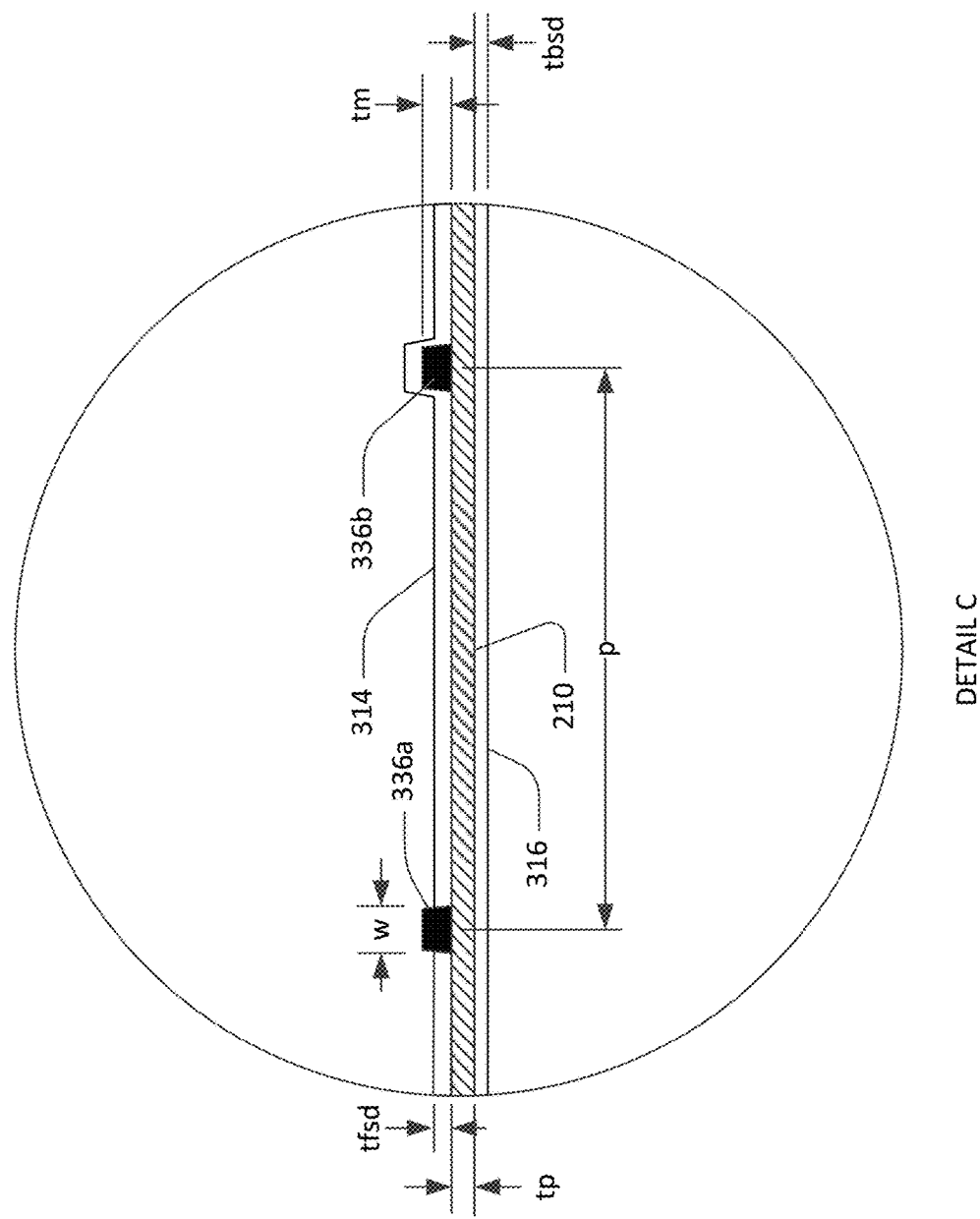
FIG. 3 is an expanded schematic cross-sectional view of a portion of the XBAR of FIG. 2.

FIG. 3 shows a detailed schematic cross-sectional view of the XBAR 200. The piezoelectric plate 210 is a single-crystal layer of piezoelectric material having a thickness tp. tp may be, for example, 100 nm to 1500 nm. When used in filters for 5G NR and Wi-Fi bands from 3.3 GHZ to 7 GHz, the thickness tp may be, for example, 250 nm to 700 nm.

A front-side dielectric layer 314 may be formed on the front side of the piezoelectric plate 210. The "front side" of the XBAR is the surface facing away from the substrate. The front-side dielectric layer 314 has a thickness tfsd. The front-side dielectric layer 314 may be formed only between the IDT fingers (see IDT finger 336a). The front side dielectric layer 314 may also be deposited over the IDT fingers (see IDT finger 336b). A back-side dielectric layer 316 may be formed on the back side of the piezoelectric plate 210. The back-side dielectric layer 316 has a thickness tbsd. The front-side and back-side dielectric layers 314, 316 may be a non-piezoelectric dielectric material, such as silicon dioxide or silicon nitride. tfsd and tbsd may be, for example, 0 to 500 nm. Thicknesses tfsd and tbsd are each typically less than one-half of the thickness tp of the piezoelectric plate. Thicknesses tfsd and tbsd are not necessarily equal, and the front-side and back-side dielectric layers 314, 316 are not necessarily the same material. Either or both of the front-side and back-side dielectric layers 314, 316 may be formed of multiple layers of two or more materials.

The IDT fingers 336a, 336b may be one or more layers of aluminum, a substantially aluminum alloys, copper, a substantially copper alloys, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers. As shown in FIG. 3, the IDT fingers 336a, 336b have rectangular or trapezoidal cross-sections. The IDT fingers may have some other cross-sectional shape.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness tp of the piezoelectric plate 210. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (232, 234 in FIG. 2) of the IDT may be the same as, or greater than, the thickness tm of the IDT fingers.

Figure 4:
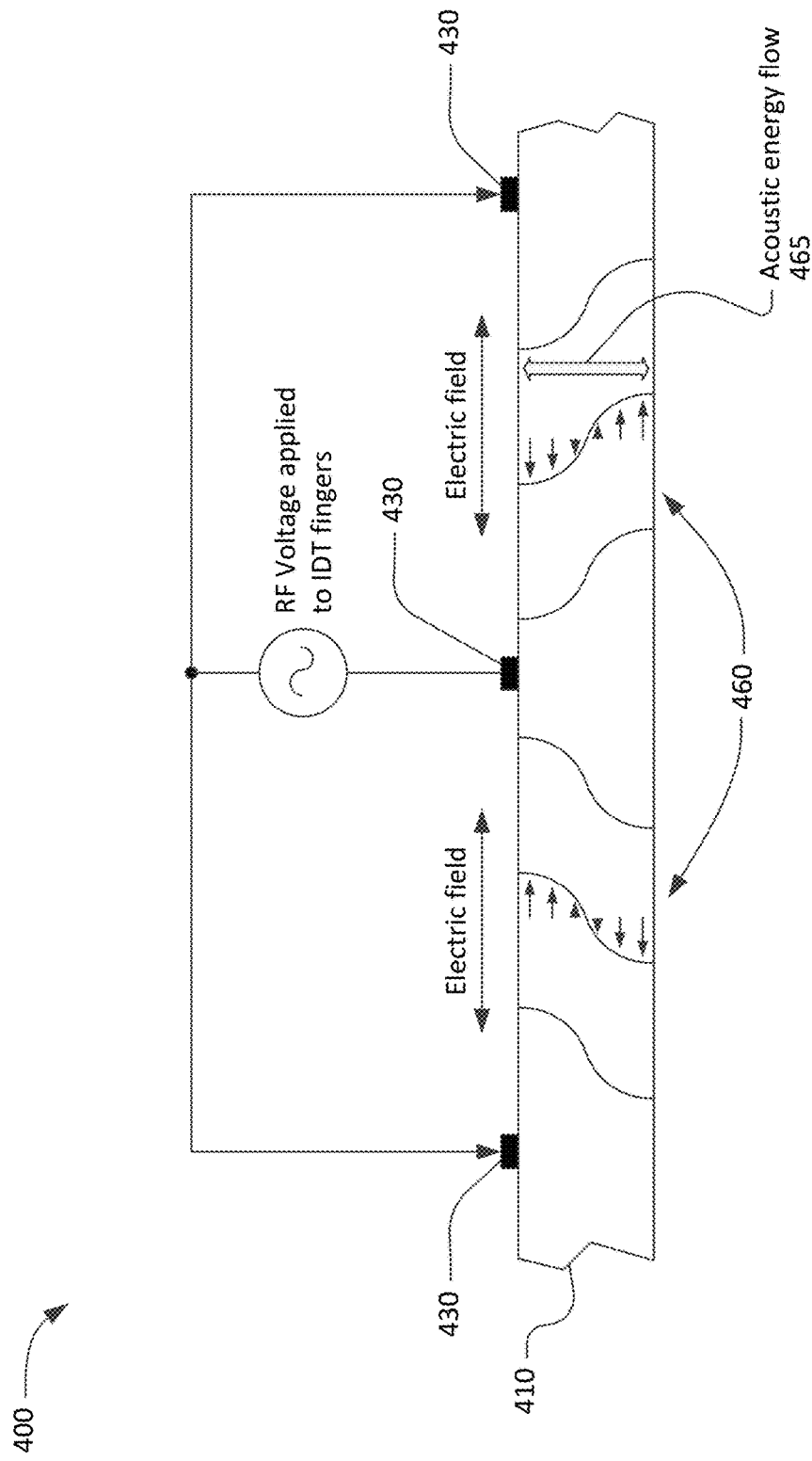
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 (e.g., see IDT fingers 336a/b and/or fingers 236). A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

The resonance frequency of an XBAR is determined by the thickness of the diaphragm and the pitch and mark (width) of the IDT fingers. The thickness of the diaphragm, which includes the thickness of the piezoelectric plate and the thicknesses of front-side and/or back-side dielectric layers, is the dominant factor determining the resonance frequency. The tuning range provided by varying the pitch and/or mark is limited to only a few percent. For broad bandwidth filters such as band-pass filter for 5G NR bands n77 and n79, 5 GHz Wi-Fi and 6 GHz Wi-Fi, the tuning range provided by varying the IDT pitch and finger width is insufficient to provide the necessary separation between the resonance frequencies of the shunt and the anti-resonance frequencies of the series resonators.

U.S. Pat. No. 10,491,192 describes the use of a front-side dielectric frequency setting layer formed only over shunt resonators to extend the bandwidth capability of XBAR filters. The dielectric frequency setting layer increases the thickness of the diaphragms of the shunt resonators and thus reduces the resonance frequency of the shunt resonators relative to the series resonators which decreases the frequency of the lower edge of the filter passband. However, there is a practical limit to the thickness of a frequency setting layer because a thick dielectric layer fosters additional spurious modes that may degrade filter performance.

U.S. Pat. No. 10,917,072 describes filters with series resonators and shunt resonators on different chips with different piezoelectric plate thicknesses. The piezoelectric plate of the chip with the shunt resonators is thicker than the piezoelectric plate of the chip with the series resonators. Thus, the resonance frequencies of the shunt resonators are lower than the resonance frequencies of the series resonators.

U.S. Pat. No. 11,201,601 describes filters with series resonators and shunt resonators with different piezoelectric plate thicknesses on a single chip. The piezoelectric plate of the shunt resonators is thicker than the piezoelectric plate of the series resonators. Thus, the resonance frequencies of the shunt resonators are lower than the resonance frequencies of the series resonators.

Figure 5:
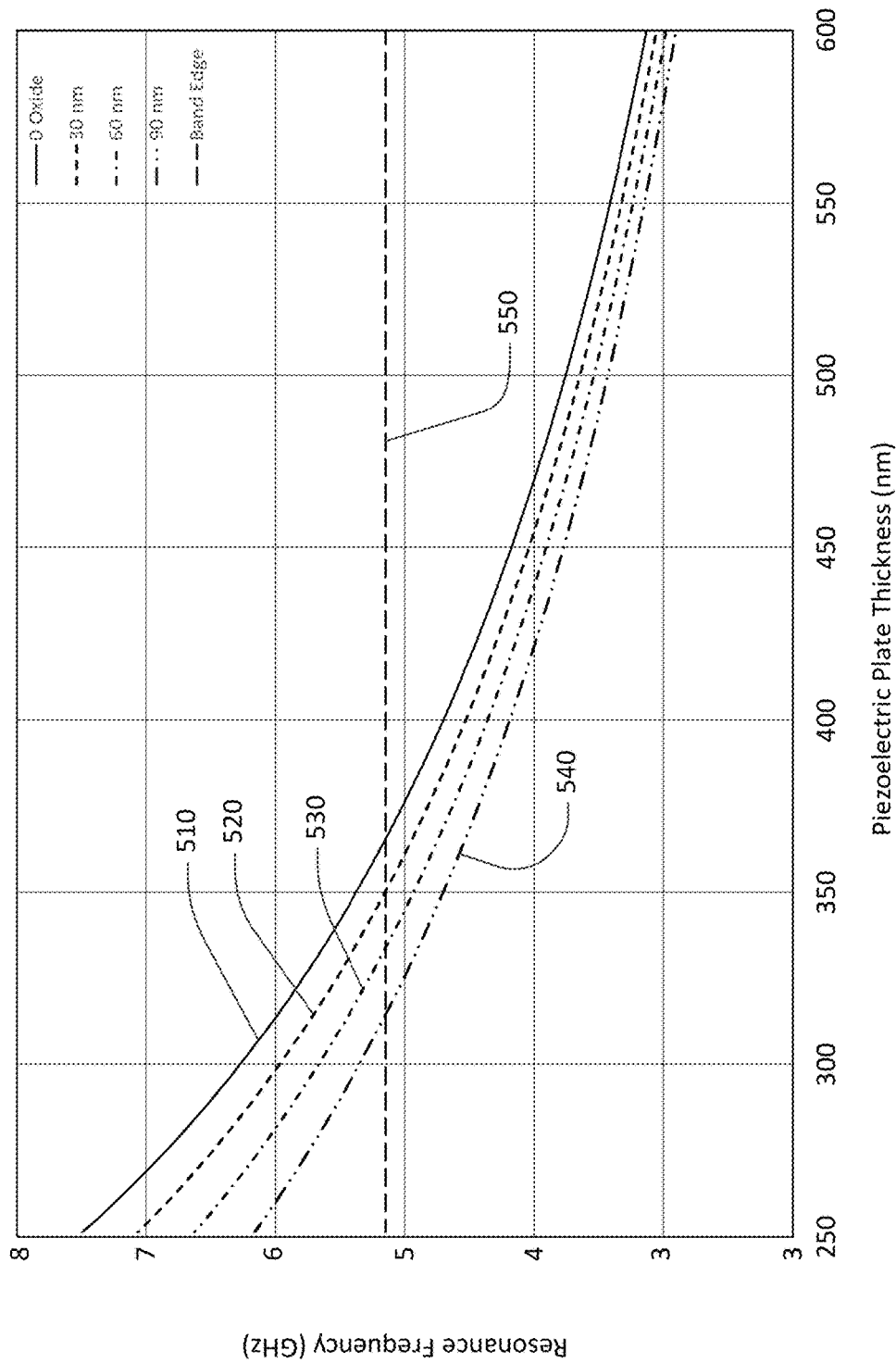
FIG. 5 is a graph of the resonance frequency of an XBAR as a function of piezoelectric plate thickness for four different dielectric thicknesses.

FIG. 5 is graph 500 of the relationship between the resonance frequency, piezoelectric plate thickness, and top-side dielectric thickness for representative XBARs using lithium niobate piezoelectric plates with Euler angles of [0°, 0°, 90°]. Such plates are commonly referred to as "Z-cut".

The solid line 510 is a plot of the dependence of resonance frequency on piezoelectric plate thickness without a front-side dielectric layer. The short-dash line 520 is a plot of the dependence of resonance frequency on piezoelectric plate thickness with a front-side dielectric layer thickness of 30 nm. The dot-dash line 530 is a plot of the dependence of resonance frequency on piezoelectric plate thickness with a front-side dielectric layer thickness of 60 nm. The dot-dot-dash line 540 is a plot of the dependence of resonance frequency on piezoelectric plate thickness with a front-side dielectric layer thickness of 90 nm. In all cases, the piezoelectric plate is Z-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The dielectric layers are $SiO_2$. There is no back-side dielectric layer.

The long-dash line 550 marks the lower edge of the 5 GHz Wi-Fi bands at 5.15 GHz.

As previously described, in a ladder filter circuit, shunt resonators provide transmission zeros at frequencies below the lower edge of the filter passband. To this end, the resonance frequencies of the shunt resonators of a filter for the 5 GHz Wi-Fi bands must be less than 5150 MHz. Exactly how much less than 5150 MHz depends on the filter specifications, the Q-factors of the shunt resonators, and allowances for manufacturing tolerances and temperature variations. Commonly, the resonance frequencies of shunt resonators are less than the lower band edge by at least 2% of the frequency of the lower band edge (103 MHz in this example).

From FIG. 5 it can also be seen that 90 mm layer of $SiO_2$ has the same effect on resonance frequency as roughly a 50 nm change in the thickness of the lithium niobate piezoelectric plate. The thicknesses of the lithium niobate piezoelectric plate and the front-side $SiO_2$ layer can be combined to provide an equivalent thickness of the XBAR diaphragm as follows:

$$teqr = tp + kr(tfsd) \qquad (1)$$

where teqr is the "LN-equivalent" thickness (i.e. the thickness of lithium niobate having the same resonance frequency) of the diaphragm for shunt resonators. The thicknesses tp and tfsd are the thickness of the piezoelectric plate and front-side dielectric layer as previously defined, and kr is a constant that is proportionally constant for shunt resonators. kr depends on the material of the front-side dielectric layer. When the front-side dielectric layer is $SiO_2$, kr is approximately 0.54.

Figure 6:
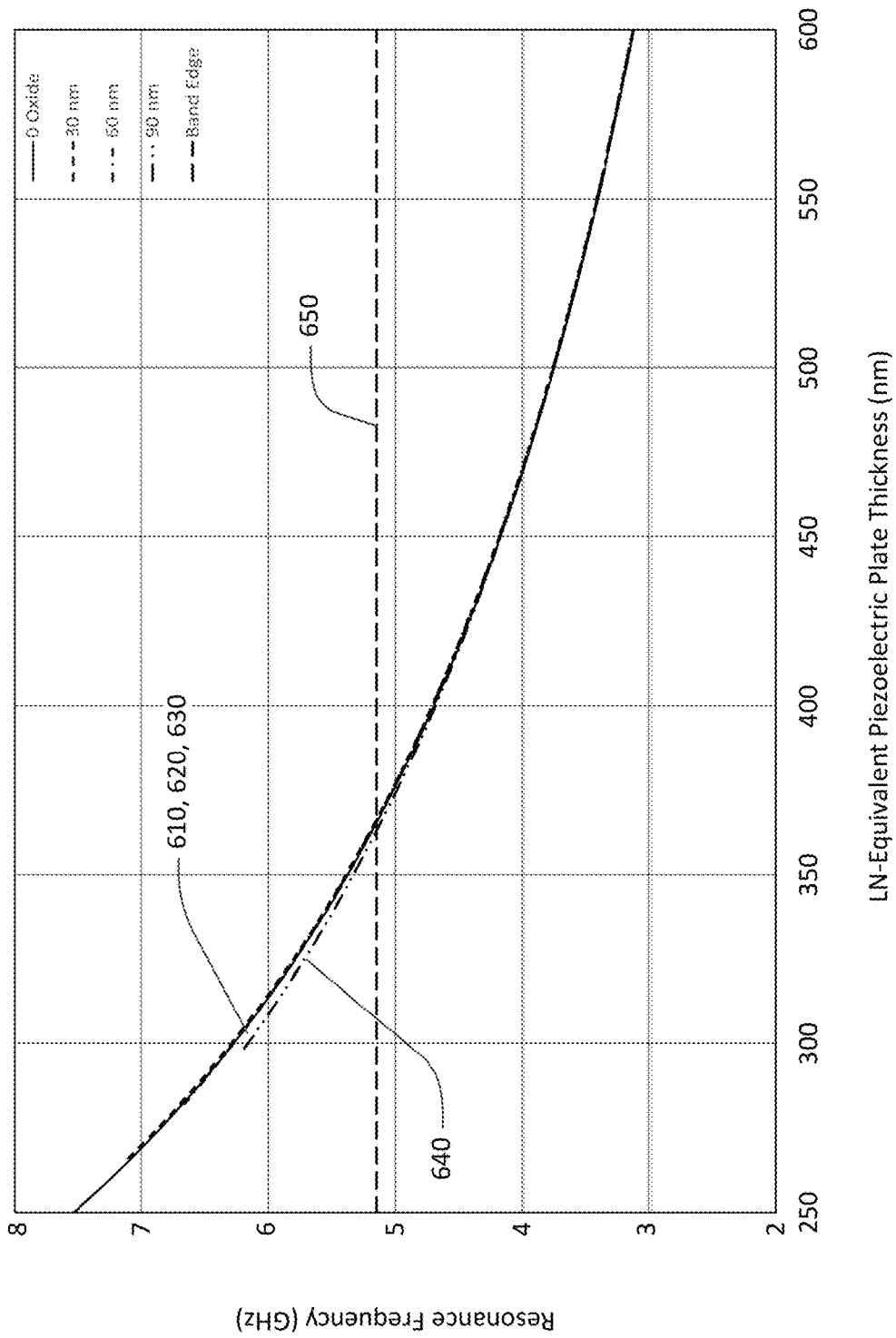
FIG. 6 is a graph of the resonance frequency of an XBAR as a function of equivalent diaphragm thickness for four different dielectric thicknesses.

FIG. 6 is a graph 600 of the dependence of resonance frequency on LN-equivalent diaphragm thickness. The data shown in FIG. 6 is the same as the data shown in FIG. 5, with LN-equivalent thickness calculated using formula (1) with k=0.54. The solid line 610 is a plot of the dependence of resonance frequency on LN-equivalent piezoelectric plate thickness without a front-side dielectric layer. The short-dash line 620 is a plot of the dependence of resonance frequency on LN-equivalent piezoelectric plate thickness with a front-side dielectric layer thickness of 30 nm. The dot-dash line 630 is a plot of the dependence of resonance frequency on LN equivalent piezoelectric plate thickness with a front-side dielectric layer thickness of 60 nm. The dot-dot-dash line 640 is a plot of the dependence of resonance frequency on LN equivalent piezoelectric plate thickness with a front-side dielectric layer thickness of 90 nm. In all cases, the piezoelectric plate is Z-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The dielectric layers are $SiO_2$. There is no back-side dielectric layer.

The three curves 610, 620, 630 are substantially superimposed. The curve 640, representing the thickest dielectric layer, deviates from the other curves for thin piezoelectric plates.

The data in FIG. 6 is specific to XBARs with the IDT pitch equal to 10 times the piezoelectric plate thickness, a preferred range of the pitch of an XBAR is 6 to 12.5 times the IDT pitch (see U.S. Pat. No. 10,637,438). Electromechanical coupling decreases sharply for pitch less than 6 time the piezoelectric plate thickness, reducing the difference between the resonance and anti-resonance frequencies. Increasing the pitch above 12.5 times the piezoelectric plate thickness reduces capacitance per unit resonator area with little benefit in terms of electromechanical coupling or frequency change.

Reducing the pitch to 6 times the piezoelectric plate thickness increases resonance frequency by about 4.5% compared to an XBAR with pitch equal to 10 times the piezoelectric plate thickness. Increasing the pitch to 12.5 times the piezoelectric plate thickness reduces resonance frequency by about 1.1% compared to an XBAR with pitch equal to 10 times the piezoelectric plate thickness. An XBAR with pitch equal to 6 times the piezoelectric plate thickness will need a 4.5% thicker diaphragm to have the same resonance frequency as an XBAR with pitch equal to 10 times the piezoelectric plate thickness. An XBAR with pitch equal to 12.5 times the piezoelectric plate thickness will need a 1.1% thinner diaphragm to have the same resonance frequency as an XBAR with pitch equal to 10 times the piezoelectric plate thickness.

The long-dash horizontal line 650 represents the lower edges of the 5 GHz Wi-FI bands at 5.15 GHz. To ensure that the resonance frequencies of shunt resonators are lower than 5.15 GHz, the LN-equivalent plate thickness must be greater than 365 nm. The LN-equivalent plate thickness would be reduced to about 360 nm if the pitch is increased to 12.5 time the piezoelectric plate thickness. In a filter for 5 GHz Wi-Fi bands, the diaphragms of all of the shunt resonators will have LN-equivalent thicknesses of greater than 360 nm. Typically, at least one shunt resonator will have a LN-equivalent diaphragm thickness of 365 nm to 375 nm to provide a transmission zero a at resonance frequency 50 MHz to 200 MHz less than the lower band edge (i.e. at 4.95 GHz to 5.10 GHz).

The LN-equivalent thickness of the diaphragm of the shunt resonators need not be the same. One or more additional dielectric layer may be formed over a subset of the shunt resonators to lower their resonance frequencies (for example to increase attenuation in a stop band below the lower band edge). While there is no absolute upper limit on the thickness of a front-side dielectric layer, XBARs with tfsd/tp>0.30 tend to have substantial spurious modes. Thus, a practical upper limit on LN-equivalent diaphragm thickness is about (1+0.3×0.54)(360 nm)=418 nm.

Figure 7:
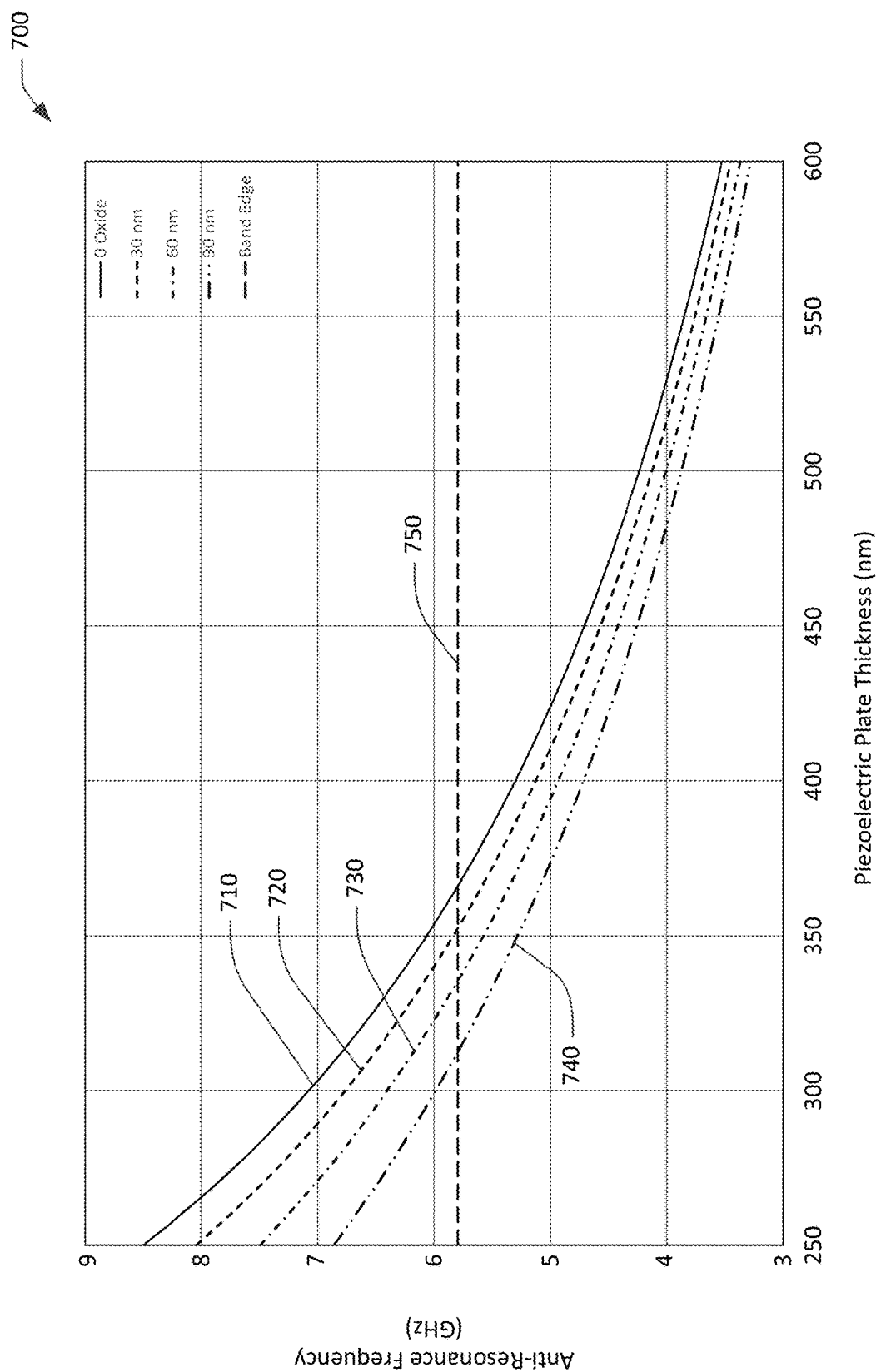
FIG. 7 is a graph of the anti-resonance frequency of an XBAR as a function of piezoelectric plate thickness for four different dielectric thicknesses.

FIG. 7 is a graph 700 of the relationship between the anti-resonance frequency, piezoelectric plate thickness, and top-side dielectric thickness for representative XBARs. The solid line 710 is a plot of the dependence of anti-resonance frequency on piezoelectric plate thickness without a front-side dielectric layer. The short-dash line 720 is a plot of the dependence of anti-resonance frequency on piezoelectric plate thickness with a front-side dielectric layer thickness of 30 nm. The dot-dash line 730 is a plot of the dependence of anti-resonance frequency on piezoelectric plate thickness with a front-side dielectric layer thickness of 60 nm. The dot-dot-dash line 740 is a plot of the dependence of anti-resonance frequency on piezoelectric plate thickness with a front-side dielectric layer thickness of 90 nm. In all cases, the piezoelectric plate is Z-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The dielectric layers are SiO$_2$. There is no back-side dielectric layer.

The long-dash line 750 marks the upper edge of the 5 GHz Wi-Fi bands at 5.795 GHz. From FIG. 7, one can see that an anti-resonance frequency above 5.795 GHz can be obtained by different combinations of piezoelectric plate thickness and dielectric thickness. For example, with no dielectric layer, a piezoelectric plate thickness of about 365 nm results in an anti-resonance frequency of 5.795 GHz. Alternatively, a piezoelectric plate thickness of 312 nm with a 90 nm dielectric layer also provides an anti-resonance frequency of 5.795 GHz.

As previously described, in a ladder filter circuit, series resonators provide transmission zeros at frequencies above the upper edge of the filter passband. To this end, the anti-resonance frequencies of the series resonators of a filter for the 5 GHz Wi-Fi bands must be greater than 5.795 GHz. Exactly how much greater than 5.795 GHz depends on the filter specifications, the Q-factors of the series resonators, and allowances for manufacturing tolerances and temperature variations including temperature increases due to power consumed in the filter during transmission.

From FIG. 7 it can also be seen that a 90 mm layer of SiO$_2$ has the same effect on resonance frequency as roughly a 58 nm change in the thickness of the lithium niobate piezoelectric plate. The thicknesses of the lithium niobate piezoelectric plate and the front-side SiO$_2$ layer can be combined to provide an equivalent thickness of the XBAR diaphragm as follows:

$$teqa = tp + ka(tfsd) \qquad (1)$$

where teqa is the "LN-equivalent" thickness (i.e. the thickness of lithium niobate having the same resonance frequency) of the diaphragm for series resonators. The thicknesses tp and tfsd are the thickness of the piezoelectric plate and front-side dielectric layer as previously defined, and ka is a constant that is a proportionally constant for series resonators. Constant ka depends on the material of the front-side dielectric layer. When the front-side dielectric layer is SiO$_2$, ka is approximately 0.52.

Figure 8:
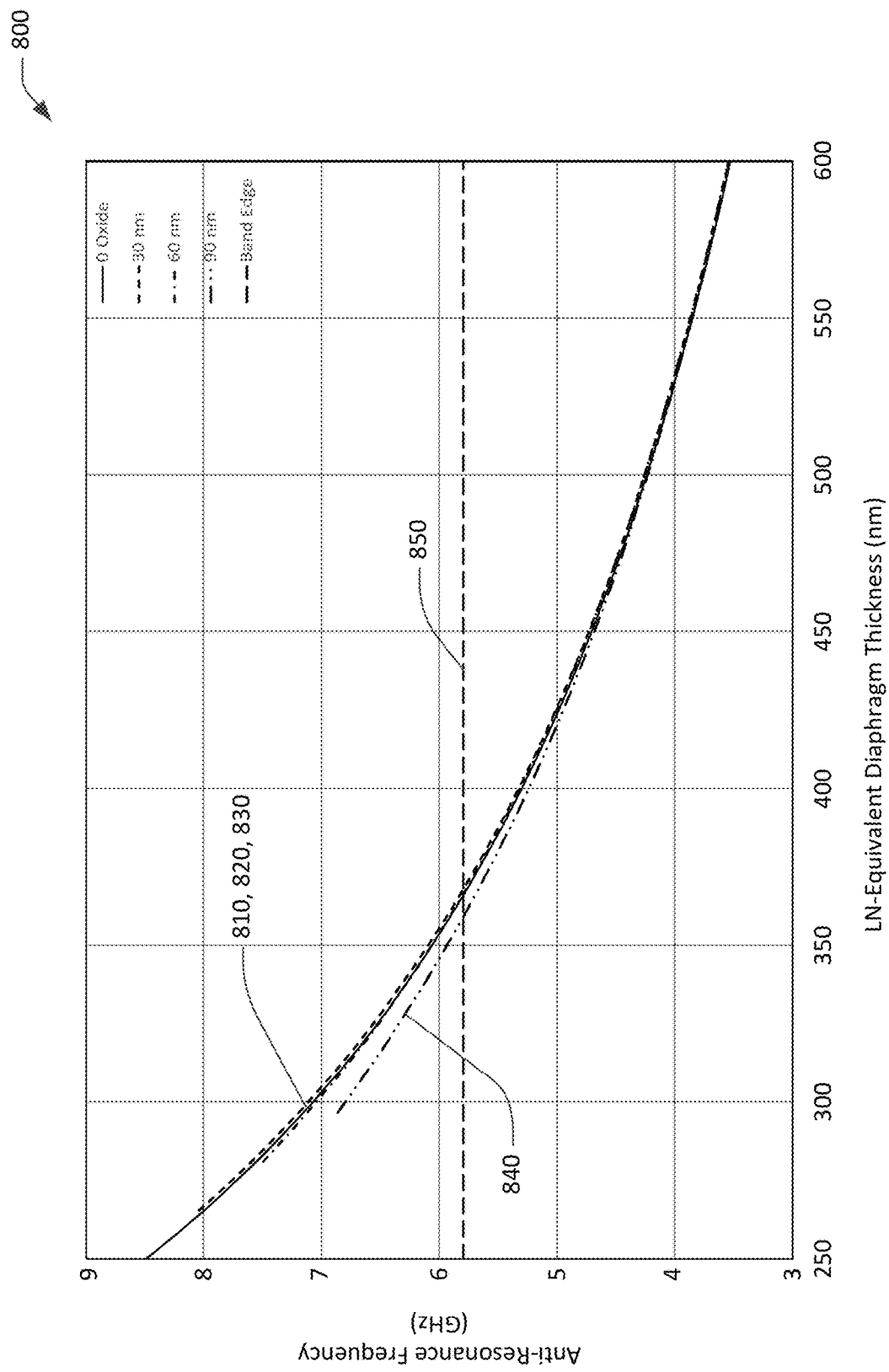
FIG. 8 is a graph of the anti-resonance frequency of an XBAR as a function of equivalent diaphragm thickness for four different dielectric thicknesses.

FIG. 8 is a graph 800 of the dependence of anti-resonance frequency on LN-equivalent diaphragm thickness. The data shown in FIG. 8 is the same as the data shown in FIG. 7, with LN-equivalent thickness calculated using formula (1) with ka=0.52. The solid line 810 is a plot of the dependence of anti-resonance frequency on LN-equivalent piezoelectric plate thickness without a front-side dielectric layer. The short-dash line 820 is a plot of the dependence of anti-resonance frequency on LN-equivalent piezoelectric plate thickness with a front-side dielectric layer thickness of 30 nm. The dot-dash line 830 is a plot of the dependence of anti-resonance frequency on LN-equivalent piezoelectric plate thickness with a front-side dielectric layer thickness of 60 nm. The dot-dot-dash line 840 is a plot of the dependence of anti-resonance frequency on LN-equivalent piezoelectric plate thickness with a front-side dielectric layer thickness of 90 nm. The lines 810, 820, 830 are nearly superimposed. The line 840, representing the thickest dielectric layer, deviates from the other curves for thin diaphragm thickness, possibly due to a reduction in the resonator coupling caused by the thick dielectric layer.

The long-dash horizontal line 850 marks the upper edge of the 5 GHz Wi-Fi bands are 5.795 GHz. An LN-equivalent thickness of 365 nm, which is the thickness that provides a resonance frequency of 3300 MHz for an XBAR with pitch equal to 10 times the piezoelectric plate thickness. Reducing the pitch to 6 times the piezoelectric plate thickness increases anti-resonance frequency by about 3.2% compared to an XBAR with pitch equal to 10 times the piezoelectric plate thickness. Conversely, an XBAR with pitch equal to 6 times the piezoelectric plate thickness will need a 3.2% thicker diaphragm to have the same anti-resonance frequency as an XBAR with pitch equal to 10 times the piezoelectric plate thickness. Assuming IDT pitch is not less than 6 times the piezoelectric plate thickness, the maximum LN-equivalent thickness for series resonators of a filter for the 5 GHz Wi-Fi bands is 365 nm×1.032 or about 375 nm.

In a filter for the 5 GHz Wi-Fi bands, the diaphragms of all of the series resonators will have LN-equivalent thicknesses less than 375 nm. While there is no absolute minimum diaphragms thickness, at least one series resonator in a typical filter for the 5 GHz Wi-Fi bands will have an LN-equivalent diaphragm thickness less than 365 nm and greater than 352 nm to provide an anti-resonance frequency 100 MHz to 300 MHz greater than the upper band edge.

The LN-equivalent thickness of the diaphragm of the series resonators need not be the same. One or more additional dielectric layer may be formed over a subset of the series resonators. The anti-resonance frequencies of series resonators without the additional dielectric layer will be further above the upper band edge (for example to increase attenuation in a stop band above the upper band edge).

Figure 9:
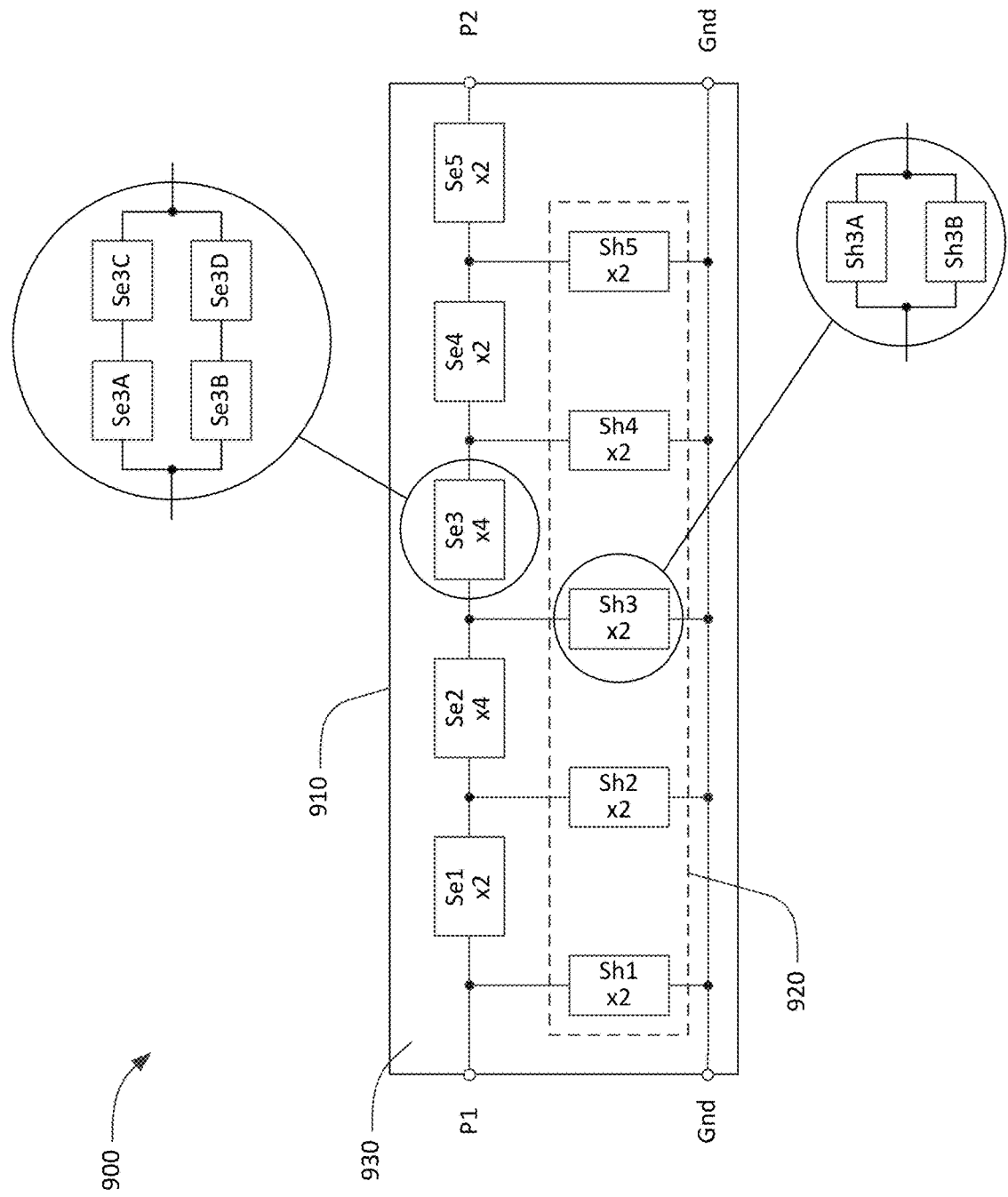
FIG. 9 is a schematic diagram of an exemplary band-pass filter for 5 GHz Wi-Fi.

FIG. 9 is a schematic circuit diagram of an exemplary filter 900 for the 5 GHz Wi-Fi bands using five series resonators Se1, Se2, Se3, Se4, Se5 and five shunt resonators Sh1, Sh2, Sh3, Sh4, Sh5. The filter 900 has a conventional ladder filter architecture. The five series resonators Se1, Se2, Se3, Se4, Se5 are connected in series between a first port P1 and a second port P2. The filter 900 is bidirectional and either port may serve as the input or output of the filter. Shunt resonator Sh1 is connected from port P1 to ground. The other four shunt resonators Sh2, Sh3, Sh4, Sh5, are connected from nodes between the series resonators to ground. All the shunt resonators and series resonators are composed of multiple XBAR sub-resonators connected in parallel. The number of sub-resonators is indicated below the reference designator (e.g. "x4") of each resonator, where x4 represents four sub-resonators and x2 represents two sub-resonators. Dividing an XBAR into multiple sub-resonators has a primary benefit of reducing the peak stress that would occur if each XBAR had a single large diaphragm. The multiple sub-resonators of each resonator typically, but not necessarily, have the same aperture and approximately the same length.

The pitch and mark of the sub-resonators comprising any of the series or shunt resonators are not necessarily the same. As shown in the detailed schematic diagram, series resonator Se3 is composed of four sub-resonators Se3A, Se3B, Se3C, Se3D. Pair of series sub-resonators Se3A, Se3C and pair of series sub-resonators Se3B, Se3D are connected in parallel. Each of the sub-resonators Se3A-Se3D has a unique mark and pitch, which is to say the mark and pitch of any sub-resonator is different from the mark and pitch of each other sub-resonator. Co-pending application Ser. No. 17/039,239, Transversely-Excited Film Bulk Acoustic Resonator with Multi-Pitch Interdigital Transducer, describes the use of small variations (e.g. ±1%) in pitch within the IDT of an XBAR to reduce the amplitude of spurious modes. The small variations in pitch shift the frequencies of spurious modes such that the spurious modes do not add constructively over the area of the XBAR. These small pitch variations have a negligible effect on the resonance and anti-resonance frequencies. The small changes in pitch between the sub-resonators Se3A, Se3B, Se3C, Se3D have a similar effect. The spurious modes of the sub-resonators do not add, resulting in lower overall spurious mode amplitude. As shown in the detailed schematic diagram, shunt resonator Sh3 is composed of two sub-resonators Sh3A, Sh3B connected in parallel. Each of the sub-resonators Sh3A-Sh3B may have a unique mark and pitch so that the spurious modes of the sub-resonators do not add as noted for the series sub-resonators. This technique is used in three of the five shunt resonators of the filter 900.

Figure 10:
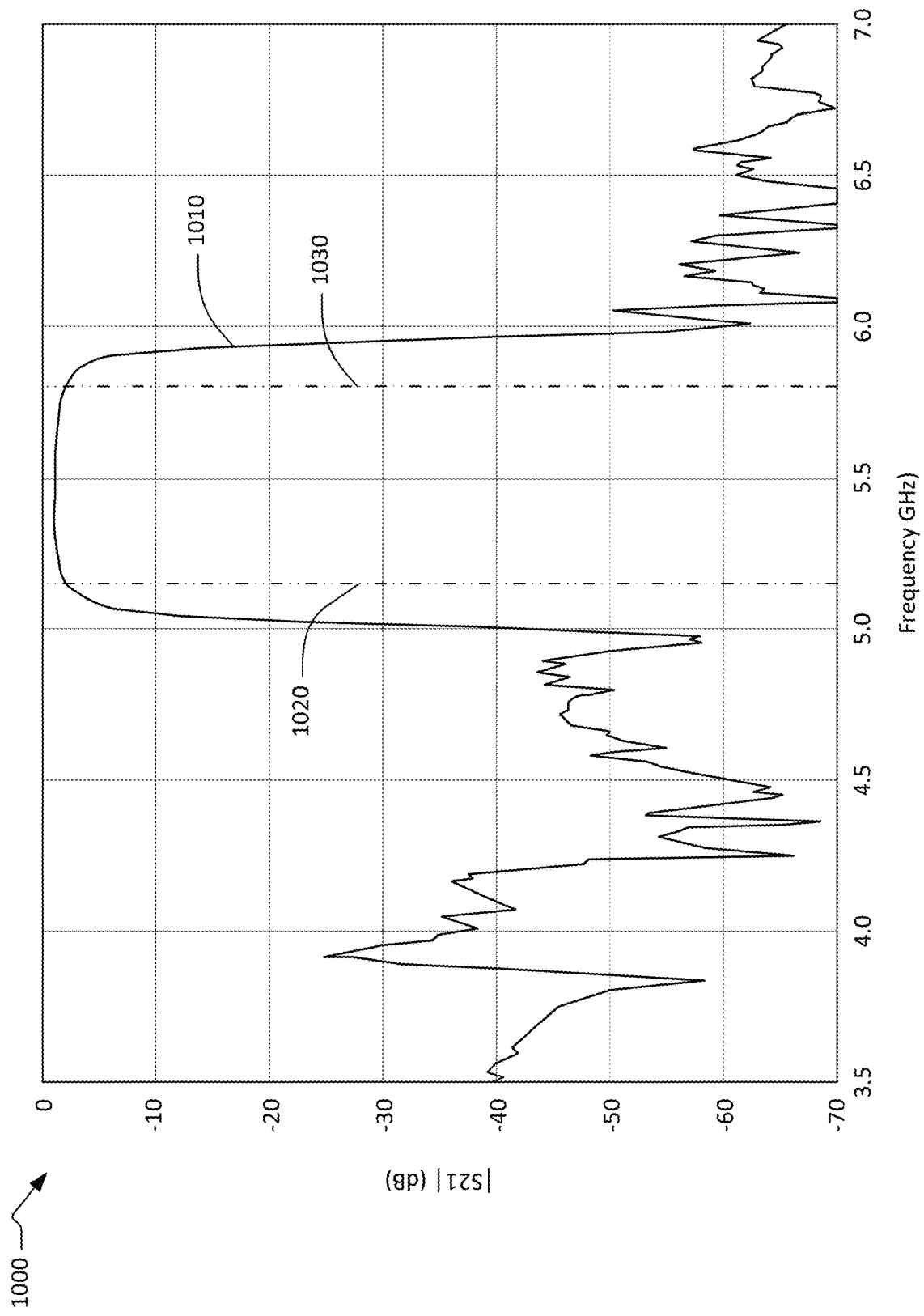
FIG. 10 is a graph of the magnitude of the input/output transfer function S21 for the exemplary band-pass filter of FIG. 9.

FIG. 10 is a graph 1000 of the performance of an exemplary filter for the 5 GHz Wi-Fi bands, which may be, or be similar to, the filter 900 of FIG. 9. Specifically, the curve 1010 is a plot of the magnitude of the input/output transfer function S21 of the exemplary filter over a frequency range from 100 MHZ to 10 GHz. The dot-dot-dash lines 1020 and 1030 mark the lower and upper edges the 5 GHz Wi-Fi bands, respectively. By selecting desired LN-equivalent thickness (e.g., plate thickness and front side dielectric thickness) as noted in FIGS. 5-8, it is possible to accomplish the desired 5 GHz Wi-Fi bands of FIG. 10. Selecting desired pitch and mark as noted for FIG. 9 can also assist in accomplishing the desired 5 GHz Wi-Fi bands of FIG. 10.

Description of Methods

Figure 11:
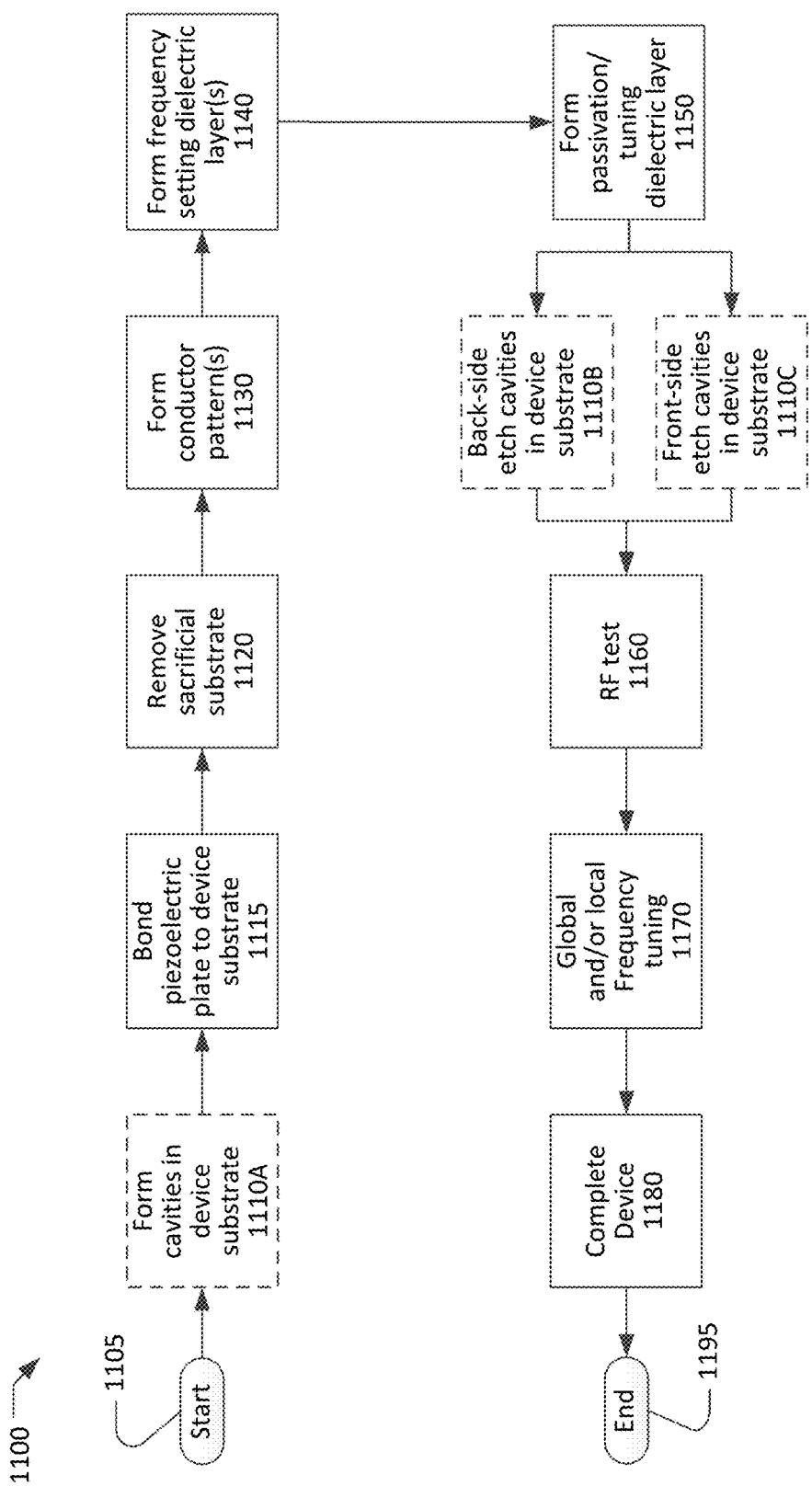
FIG. 11 is a flow chart of a process for fabricating an XBAR or a filter incorporating XBARs.

FIG. 11 is a simplified flow chart showing a process 1100 for making a wafer with a plurality of chips containing XBARs. The process 1100 starts at 1105 with a device substrate and a plate of piezoelectric material attached to a sacrificial substrate. The process 1100 ends at 1195 with a plurality of completed XBAR chips, such as those of filter 900. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11. With the exception of step 1180, all of the actions are performed concurrently on all chips on the wafer.

The flow chart of FIG. 11 captures three variations of the process 1100 for making an XBAR which differ in when and how cavities are formed in the device substrate. The cavities may be formed at steps 1110A, 1110B, or 1110C. Only one of these steps is performed in each of the three variations of the process 1100.

The piezoelectric plate may be, for example, rotated YX-cut lithium niobate. The piezoelectric plate may be some other material and/or some other cut. The substrate may preferably be silicon. The substrate may be some other material that allows formation of deep cavities by etching or other processing.

In one variation of the process 1100, one or more cavities are formed in the device substrate at 1110A before the piezoelectric plate is bonded to the substrate at 1115. A separate cavity may be formed for each resonator on the chip. The one or more cavities may be formed using conventional photolithographic and etching techniques. Typically, the cavities formed at 1110A will not penetrate through the device substrate.

At 1115, the piezoelectric plate is bonded to the device substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

The sacrificial substrate may be removed at 1120, exposing a front surface of the piezoelectric plate. The actions at 1120 may include further processes, such as polishing and/or annealing, to prepare the exposed surface for subsequent process steps.

A conductor pattern, including IDTs of each XBAR, is formed at 1130 by depositing and patterning one or more conductor layers on the front surface of the piezoelectric plate. The conductor layer may be, for example, aluminum or an aluminum alloy with a thickness of 50 nm to 150 nm. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT busbars and interconnections between the IDTs).

The conductor pattern may be formed at 1130 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1130 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

One or more optional frequency setting dielectric layers may be formed at 1140 by depositing and patterning one or more dielectric layers on the front surface of the piezoelectric plate. The dielectric layer(s) may be formed between, and optionally over, the IDT fingers of some, but not all XBARs. The frequency setting dielectric layer(s) are typically $SiO_2$, but may be $Si_3N_4$, $Al_2O_3$, or some other dielectric material. The thickness of each frequency setting dielectric layer is determined by the desire frequency shift. In the example of FIG. 9 and FIG. 10, a frequency setting dielectric layer 80 nm thick is formed over the IDTs of the five shunt resonators.

A passivation/tuning dielectric layer is formed at 1150 by depositing a dielectric material over all of the front surface of the piezoelectric plate except pads used for electric connections to circuitry external to the chip. The passivation/tuning layer may be $SiO_2$, $Si_3N_4$, $Al_2O_3$, some other dielectric material, or a combination of two or more materials. The thickness of passivation/tuning layer is determined by the minimum amount of dielectric material required to deal the surface of the chip plus the amount of sacrificial material possibly needed for frequency tuning at 1170. In the example of FIG. 9 and FIG. 10, a passivation/tuning layer 20 nm thick (after tuning) may be assumed over the IDTs of all XBARs.

In a second variation of the process 1100, one or more cavities are formed in the back side of the substrate at 1110B. A separate cavity may be formed for each resonator on the chip. The one or more cavities may be formed using an anisotropic or orientation-dependent dry or wet etch to open holes through the back side of the substrate to the piezoelectric plate.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device. The one or more cavities formed at 1110C will not penetrate through the substrate.

In all variations of the process 1100, some or all of XBARs on each chip may be measured or tested at 1160. For example, the admittance of some or all XBARs may be measured at RF frequencies to determine the resonance and/or the anti-resonance frequencies. The measured frequencies may be compared to the intended frequencies and a map of frequency errors over the surface of the wafer may be prepared.

At 1170, the frequency of some or all XBARs may be tuned by selectively removing material from the surface of the passivation/tuning layer in accordance with the frequency error map developed at 1160. The selective material removal may be done, for example, using a scanning ion mill or other tool.

In some cases, the piezoelectric plate is Z-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The frontside dielectric layers are $SiO_2$ and have a thickness of 0, 30, 60 or 90 nm. There is no back-side dielectric layer.

The chips may then be completed at 1180. Actions that may occur at 1180 include forming bonding pads or solder bumps or other means for making connection between the chips and external circuitry, additional testing, and excising individual chips from the wafer containing multiple chips. After the chips are completed, the process 1100 ends at 1195.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A bandpass filter comprising:
a ladder filter circuit comprising two or more shunt transversely-excited film bulk acoustic resonators (XBARs) and two or more series XBARs,
wherein the two or more shunt XBARs and the two or more series XBARs each comprise a diaphragm comprising a lithium niobate (LN) piezoelectric plate,
wherein the diaphragm of each of the two or more shunt XBARs has an LN-equivalent thickness greater than or equal to 360 nm, and the diaphragm of each of the two or more series XBARs has a diaphragm having an LN-equivalent thickness less than or equal to 375 nm,
wherein the at least one series XBAR of the two or more series XBAR comprises a dielectric layer with a thickness of tfsd on the diaphragm, and
wherein the LN-equivalent thickness of the at least one series resonator is teqa=tp+ka(tfsd), where teqa is the LN-equivalent thickness of the at least one series resonator, tp is a thickness of the LN piezoelectric plate of the at least one series resonator, and ka is a proportionality constant that equals approximately 0.52.

2. The bandpass filter of claim 1, wherein the LN-equivalent thickness of the diaphragm of each of the two or more shunt XBARs is greater than or equal to 370 nm.

3. The bandpass filter of claim 1, wherein the LN-equivalent thickness of the diaphragm of each of the two or more series XBARs is less than or equal to 365 nm.

4. The bandpass filter of claim 1, wherein the LN piezoelectric plate of the two or more series XBARs has a thickness less than or equal to a thickness of the LN piezoelectric plate of the two or more series-shunt resonators.

5. The bandpass filter of claim 1, wherein the LN piezoelectric plate of the two or more shunt XBARs and the two or more series XBARs has Euler angles [0°, 0°, 90°].

6. A bandpass filter comprising:
a ladder filter circuit comprising two or more shunt transversely-excited film bulk acoustic resonators (XBARs) and two or more series XBARS,
wherein the two or more shunt XBARs and the two or more series XBARs each comprise a diaphragm comprising a lithium niobate (LN) piezoelectric plate,
wherein the diaphragm of each of the two or more shunt XBARs has an LN-equivalent thickness greater than or equal to 310 nm, and the diaphragm of each of the two or more series XBARs has an LN-equivalent thickness less than or equal to 305 nm,
wherein the at least one shunt resonator of the two or more shunt resonators comprises a dielectric layer with a thickness of tdp on the diaphragm, and
wherein the LN-equivalent thickness of the at least one shunt resonator is teqr=tp+kr(tfsd), where teqr is the LN-equivalent thickness of the at least one shunt resonator, tp is a thickness of the LN piezoelectric plate of the at least one shunt resonator, and kr is a proportionality constant that equals 0.54.

7. A bandpass filter comprising:
a substrate comprising a plurality of cavities;
a lithium niobate (LN) plate supported by the substrate;
a plurality of diaphragms, each diaphragm comprising a respective portion of the piezoelectric plate that is over a respective cavity of the plurality of cavities; and
a conductor pattern comprising interdigital transducers (IDTs) of two or more series resonators and two or more shunt resonators, interleaved fingers of each IDT disposed on a respective diaphragm of the plurality of diaphragms,
wherein the diaphragms of the two or more shunt resonators have an LN-equivalent thickness greater than or equal to 360 nm, and the diaphragms of the two or more series resonators have an LN-equivalent thickness less than or equal to 375 nm, and
wherein the LN piezoelectric plate of the two or more shunt resonators and the two or more series resonators has Euler angles [0°, 0°, 90°].

8. The bandpass filter of claim 7, wherein:
the diaphragms of the two or more series resonators comprise a dielectric layer with a thickness of tfsd, and
the LN-equivalent thickness of each diaphragm of the two or more series resonators is given by:

$teqa=tp+ka(tfsd)$ where teqa is the LN-equivalent thickness, tp is a thickness of the LN plate, and ka is a proportionality constant for two or more series resonators.

9. The bandpass filter of claim 8, wherein the dielectric layer is silicon dioxide and ks=0.52.

10. The bandpass filter of claim 7, wherein:
the diaphragms of the two or more shunt resonators comprise a dielectric layer with a thickness of tfsd, and
the LN-equivalent thickness of each diaphragm of the two or more shunt resonators is given by:

$teqr=tp+kr(tfsd)$ where teqr is the LN-equivalent thickness, tp is a thickness of the LN plate, and kr is a proportionality constant for the two or more shunt resonators.

11. The bandpass filter of claim 10, wherein the dielectric layer is silicon dioxide and kr=0.54.

12. The bandpass filter of claim 7, wherein the LN-equivalent thickness of the diaphragms of the two or more shunt resonators is greater than or equal to 370 nm.

13. The bandpass filter of claim 7, wherein the LN-equivalent thickness of the diaphragms of the two or more series resonators is less than or equal to 365 nm.

14. The bandpass filter of claim 7, wherein the conductor pattern further comprises conductors to connect the two or more series resonators and the two or more shunt resonators in a ladder filter circuit.

* * * * *